United States Patent
Gotoh et al.

(10) Patent No.: US 8,462,309 B2
(45) Date of Patent: Jun. 11, 2013

(54) LIQUID CRYSTAL DISPLAY DEVICE

(75) Inventors: Yasuko Gotoh, Mobara (JP); Kazuhiko Koyahara, Joso (JP)

(73) Assignees: Hitachi Displays, Ltd., Chiba (JP); Panasonic Liquid Crystal Display Co., Ltd., Hyogo (JP)

( * ) Notice: Subject to any disclaimer, the term of this patent is extended or adjusted under 35 U.S.C. 154(b) by 242 days.

(21) Appl. No.: 12/702,955

(22) Filed: Feb. 9, 2010

(65) Prior Publication Data

US 2010/0245699 A1 Sep. 30, 2010

(30) Foreign Application Priority Data

Mar. 31, 2009 (JP) ................... 2009-086206

(51) Int. Cl.
*G02F 1/1339* (2006.01)

(52) U.S. Cl.
USPC .......................................... 349/155; 349/147

(58) Field of Classification Search
USPC .................................................. 349/155–157
See application file for complete search history.

(56) References Cited

U.S. PATENT DOCUMENTS

| | | | |
|---|---|---|---|
| 5,338,240 A * | 8/1994 | Kim ................................. | 445/24 |
| 6,549,260 B1 | 4/2003 | Shibahara | |
| 2003/0128311 A1* | 7/2003 | Tsuda et al. ................... | 349/106 |
| 2007/0263162 A1* | 11/2007 | Kang et al. ..................... | 349/155 |

FOREIGN PATENT DOCUMENTS

| | | |
|---|---|---|
| JP | 03-042626 | 2/1991 |
| JP | 9-49914 | 2/1997 |
| JP | 10-253967 | 9/1998 |
| JP | 2000-275664 | 10/2000 |

* cited by examiner

*Primary Examiner* — Jessica M Merlin

(74) *Attorney, Agent, or Firm* — Antonelli, Terry, Stout & Kraus, LLP.

(57) ABSTRACT

A liquid crystal display device and a manufacturing method thereof which can suppress chipping of an alignment film or the like are provided. A liquid crystal display device and a manufacturing method thereof which can obviate the complication of manufacturing steps and the increase of a manufacturing cost are also provided. A liquid crystal display device includes: a TFT substrate; a counter substrate; and liquid crystal sandwiched between the TFT substrate and the counter substrate. A plurality of color filters are arranged on the counter substrate, and spacers are formed by stacking the plurality of color filters and by covering a surface of stacked color filters with an overcoat layer. Pedestals are formed on the TFT substrate in a state where the pedestal faces the spacer in an opposed manner. The pedestal is formed by stacking at least a semiconductor layer and a metal layer formed which are simultaneously with a thin film transistor on the TFT substrate. A width of a pedestal portion constituted of the semiconductor layer is substantially equal to a width of the spacer.

6 Claims, 10 Drawing Sheets

LIQUID CRYSTAL DISPLAY DEVICE

The present application claims priority from Japanese application JP2009-086206 filed on Mar. 31, 2009, the content of which is hereby incorporated by reference into this application.

BACKGROUND OF THE INVENTION

1. Field of the Invention

The present invention relates to a liquid crystal display device and a manufacturing method thereof, and more particularly to a liquid crystal display device in which a predetermined distance is held between a TFT substrate and a counter substrate by a support column system and a manufacturing method thereof.

2. Background Art

In a liquid crystal display device, liquid crystal is filled in a space defined between a TFT substrate on which pixel electrodes and thin film transistors (TFT) are formed and a counter substrate on which color filters and the like are formed, and images are formed by controlling molecules of the liquid crystal using an electric field. The distance between the TFT substrate and the counter substrate is extremely narrow, that is, several microns. Accordingly, proper setting of the distance between the TFT substrate and the counter substrate is extremely important for controlling transmissivity of light through the liquid crystal.

As an example of a method for setting a distance between a TFT substrate and a counter substrate, there has been known a method which disperses beads or the like in the space formed between the substrates. However, in dispersing the beads in the space, the beads are dispersed into regions where pixel electrodes are formed and hence, there arises a drawback that light is scattered in such portions thus lowering a contrast.

On the other hand, with respect to a conventional liquid crystal filling method, there have been proposed a method in which a space defined between a TFT substrate and a counter substrate is sealed, an opening is formed in a portion of a sealing material, and liquid crystal is filled in the space through the opening, and a method in which a necessary amount of liquid crystal is dropped on a TFT substrate and, thereafter, a counter substrate is adhered to the TFT substrate in a sealed manner thus sealing liquid crystal in the space, and the like. In any one of these methods, in dispersing beads in the space, the beads move in the space at the time of dropping the liquid crystal into the space and hence, the number of beads becomes large in some places of the space and the number of beads becomes small in other places of the space. Further, the beads are also dispersed into the inside of pixel regions where light emitted from a backlight passes thus lowering a numerical aperture of a liquid crystal display device or giving rise to a possibility of lowering a numerical aperture of the liquid crystal display device.

As a method which defines a distance between the TFT substrate and the counter substrate, besides the above-mentioned example which makes use of the beads, there has been known a method which forms support columns (spacers) formed of an organic film on the counter substrate (support column system). The support columns are, in general, mounted on portions of the counter substrate where the pixel electrodes are not present, that is, portions of the counter substrate through which light from the back light does not pass. Accordingly, there is no possibility that brightness (numerical aperture) is lowered due to the presence of the support columns. Further, the support columns are fixed to the counter substrate and hence, there is no possibility that the support columns move even when liquid crystal is dropped. Accordingly, the method which maintains the distance between the TFT substrate and the counter substrate using the support columns is also preferably applicable to a system which drops liquid crystal (liquid crystal dropping sealing system).

The support columns are formed on color filters formed on the counter substrate in general and are formed using a resin. JP-A-9-49914 (patent document 1) discloses such a case.

Further, there may also be a case where a support column is formed by stacking color filters as in the case of JP-A-2003-233064 (corresponding to US patent application US2003/0156236A1)(patent document 2).

Further, there may be a case where, on a portion of a TFT substrate side with which a spacer formed of color filters is brought into contact, a pedestal is formed. The pedestal is provided for holding a distance between a TFT substrate and a counter substrate more properly by cooperatively working with the spacer. It is often the case that the pedestal is formed by making use of a projecting portion of a gate line or a drain line such as a switching element on the gate line as described in patent document 1. Further, on a surface of an insulation film on a TFT substrate side, an alignment film which adjusts the alignment of liquid crystal is formed.

SUMMARY OF THE INVENTION

In forming the TFT substrate, to decrease the number of manufacturing steps, so-called collective forming of an SD layer and an a-Si layer is performed. In this collective forming, a metal layer which becomes sources and drains (SD) of thin film transistors and semiconductor layers formed of an amorphous silicon (a-Si) film are stacked on a substrate, and the metal layer and the semiconductor layers are formed into desired patterns by performing an exposure process one time. FIG. 1A to FIG. 3J show a process of the collective forming. Here, FIG. 1A to FIG. 3J are cross-sectional views taken along a line B-B in FIG. 11 which is a plan view of a pixel.

To explain the process of the collective forming of the SD and the a-Si film, as shown in FIG. 1A, on the substrate SUB1 which becomes the TFT substrate, a metal layer M1 which becomes gate scanning lines is formed. In FIG. 1A, a right side of the metal layer M1 defines a region where the thin film transistor TFT is formed, and a left side of the metal layer M1 defines a region where a pedestal which is brought into contact with a spacer formed on a counter substrate is formed.

An insulation film IL1 made of a material such as SiN is formed on the metal layer M1, and a semiconductor layer S1 made of a-Si or the like is formed on the insulation film IL1 by a CVD film forming method.

Further, a metal layer M2 is formed on the a-Si film S1 as shown in FIG. 1B.

To form the respective film bodies such as the SD layer and the a-Si layer into predetermined shapes, a photo resist method is used. A resist film is formed on the metal layer M2 as shown in FIG. 1B, and the resist film is exposed and developed by making use of a photo mask PM having a predetermined mask pattern. FIG. 1C shows resist patterns RP1, RP2 formed by the exposure and the development. For example, as shown in FIG. 1C, a resist material corresponding to a mask pattern portion MP remains, and a resist material having a thickness smaller than a thickness of the resist material corresponding to the mask pattern portion MP remains at a half-exposure pattern portion HP which allows a larger amount of light to pass therethrough compared to the mask pattern portion MP as shown in FIG. 1C.

Next, by applying wet etching to the structure formed in the above-mentioned manner, as shown in FIG. 2D, the metal layer M2 remains correspondingly to the resist patterns RP1, RP2.

Further, as shown in FIG. 2E, the semiconductor layer S1 is etched by dry etching by making use of the resist patterns PR1 and PR2.

Next, ashing treatment is applied to the resist pattern so as to remove the resist material corresponding to the half-exposure pattern portion HP as shown in FIG. 2F. By applying wet etching to the above-mentioned structure by making use of the resist pattern, as shown in a right side of FIG. 2G, an electrode pattern corresponding to the source/drain electrodes of the thin film transistors TFT is formed on the metal layer M2. Further, on a left side of FIG. 2G, a portion which becomes a pedestal for the metal layer M2 is formed.

After peeling off the resist pattern as shown in FIG. 3H, on a surface of the TFT substrate SUB1, an insulation film IL2 which constitutes a protective film is formed as shown in FIG. 3I. On a surface of the insulation film IL2, an alignment film OF which adjusts the alignment of liquid crystal is formed as shown in FIG. 3J.

On the TFT substrate, not only the thin film transistors but also the above-mentioned pedestal portions are formed simultaneously. The pedestal (PDS) portion indicated by a frame A in FIG. 33 is configured to be adhered to a spacer SPC formed on a counter substrate SUB2 as shown in FIG. 4.

As shown in FIG. 4, the spacer SPC formed on the counter substrate SUB2 is constituted of color filters (R: red filter, G: green filter, B: blue filter) which are stacked on a black matrix BM and an overcoat layer OC which covers a surface of the color filters as a protective film. Although an alignment film is also formed on the overcoat layer OC, the description of the alignment film is omitted here.

The pedestal PDS formed on the TFT substrate SUB1 is configured such that the insulation film IL1, the semiconductor layer S1 made of amorphous silicon or the like which is used for forming a thin film transistor, the metal layer M2 which is used for forming the source/drain electrodes of the thin film transistors and the like are sequentially stacked on the metal layer M1 which becomes the gate scanning line GL, and a surface of the stacked structure is covered with an insulation film IL2. Further, the alignment film OF which adjusts the alignment of liquid crystal is formed on a surface of the insulation film IL2.

As described previously, in the process where the metal layer M2 for forming the source/drain electrodes and the semiconductor layer S1 are collectively formed in the formation of the thin film transistors TFT of the TFT substrate SUB1, the metal layer M2 and the semiconductor layer S1 are etched differently using one resist pattern (FIG. 2D to FIG. 2G). Accordingly, there arises a phenomenon where the metal layer M2 becomes smaller than the resist pattern PR2. As a result, as indicated by a portion D' shown in FIG. 4, the stacked structure is formed in a state where the metal layer M2 projects toward the periphery of the semiconductor layer S1 although a projecting amount is extremely small, that is, approximately 1 μm to 2 μm.

In a state where the TFT substrate SUB1 and the counter substrate SUB2 are adhered to each other, a distal end of the pedestal PDS sticks in and is embedded into the spacer SPC. Particularly, the spacer formed by stacking the color filters is, since the filter per se is made of a resin, liable to be elastically deformable and hence, the pedestal is liable to easily stick in the spacer. To be more specific, a part of a distal end portions of the pedestal PDS is embedded into the spacer SPC. Accordingly, it is often the case that a stepped portion of the pedestal PDS is brought into contact with a surface of the spacer SPC.

Accordingly, when a liquid crystal display device vibrates during the transportation or during the use of the liquid crystal display device, the TFT substrate SUB1 and the counter substrate SUB2 rub each other. As a result, between the pedestal PDS and the spacer SPC, chipping OC1 of the overcoat layer or chipping OF1 of the alignment film on a side (stepped portion) of the pedestal occurs. Particularly, the rubbing of the stepped portion between the semiconductor layer S1 and the metal layer M2 of the pedestal PDS with the spacer SPC side largely influences the occurrence of chipping.

Such a chipped overcoat film or alignment film floats in the liquid crystal layer LC and may cause bright spots in a display region.

It is an object of the invention to provide a liquid crystal display device and a manufacturing method thereof which can overcome such drawbacks and can suppress chipping of an alignment film or the like.

It is another object of the invention to provide a liquid crystal display device and a manufacturing method thereof which can obviate the complication of manufacturing steps and the increase of a manufacturing cost.

The invention is, to overcome the above-mentioned drawbacks, characterized in that peeling-off of an alignment film is suppressed by increasing an area where the alignment film is adhered to an insulation film, and peeling-off of the alignment film or an overcoat film is suppressed by obviating a contact between a spacer on a counter substrate side and a peripheral portion (stepped portion or the like) of a pedestal on a TFT substrate side. The specific constitution is as follows.

(1) According to one aspect of the invention, there is provided a liquid crystal display device which includes: a TFT substrate; a counter substrate; and liquid crystal sandwiched between the TFT substrate and the counter substrate, wherein a plurality of color filters are arranged on the counter substrate, and spacers are formed by stacking the plurality of color filters and by covering a surface of stacked color filters with an overcoat layer, pedestals are formed on the TFT substrate in a state where the pedestal faces the spacer in an opposed manner, the pedestal is formed by stacking at least a semiconductor layer and a metal layer which are formed simultaneously with a thin film transistor on the TFT substrate, and a width of the semiconductor layer is substantially equal to a width of the spacer.

(2) In the liquid crystal display device having the above-mentioned constitution (1), an insulation film and an alignment film are formed on a liquid crystal side of the semiconductor layer and the metal layer of the pedestal, the pedestal is formed on a gate scanning line, and a width of the semiconductor layer at the pedestal portion is substantially equal to a width of the gate scanning line.

(3) According to another aspect of the invention, there is provided a liquid crystal display device which includes: a TFT substrate; a counter substrate; and liquid crystal sandwiched between the TFT substrate and the counter substrate, wherein a plurality of color filters are arranged on the counter substrate, and spacers are formed by stacking the plurality of color filters and by covering a surface of stacked color filters with an overcoat layer, pedestals are formed on the TFT substrate in a state where the pedestal faces the spacer in an opposed manner, the pedestal is formed by stacking at least a semiconductor layer and a metal layer which are formed simultaneously with a thin film transistor on the TFT substrate, and a side surface of the semiconductor layer and a side surface of the metal layer are formed continuously and uniformly.

(4) In the liquid crystal display device having the above-mentioned constitution (3), an insulation film and an alignment film are formed on a liquid crystal side of the semiconductor layer and the metal layer of the pedestal.

(5) According to still another aspect of the invention, there is provided a manufacturing method of a liquid crystal display device which includes: a TFT substrate; a counter substrate; and liquid crystal sandwiched between the TFT substrate and the counter substrate, wherein a plurality of color filters are arranged on the counter substrate, and spacers are formed by stacking the plurality of color filters and by covering a surface of stacked color filters with an overcoat layer, pedestals are formed on the TFT substrate in a state where the pedestal faces the spacer in an opposed manner, and the pedestal is formed by stacking at least a semiconductor layer and a metal layer which are formed simultaneously with a thin film transistor on the TFT substrate, wherein the manufacturing method includes the steps of: exposing a resist applied to a surface of the metal layer by coating using a mask pattern which decides a size of a pedestal portion constituted of the metal layer in forming the pedestal; etching the metal layer by dry etching using a pattern of the resist; and etching the semiconductor layer by dry etching using the pattern of the resist thereafter.

According to the constitutional feature (1) of the invention, by setting the width of the pedestal portion constituted of the semiconductor layer sufficiently larger than the width of the pedestal portion constituted of the metal layer, an area of the semiconductor layer of the pedestal which is adhered to the spacer on the counter substrate side is increased thus suppressing peeling-off of the alignment film. Further, it is also possible to obviate a contact between the spacer on the counter substrate side and the stepped portion of the pedestal on the TFT substrate side thus suppressing peeling-off of the alignment film or the overcoat film.

According to the constitutional feature (2) of the invention, the pedestal is formed on the gate line and the width of the pedestal portion constituted of the semiconductor layer is substantially equal to the width of the gate scanning line. Accordingly, it is possible to sufficiently ensure an area where spacer on the counter substrate side and the semiconductor layer of the pedestal are adhered to each other and, at the same time, it is possible to sufficiently obviate a contact between the spacer on the counter substrate side and the peripheral portion (stepped portion or the like) of the pedestal on the TFT substrate side.

According to the constitutional feature (3) of the invention, the width of the pedestal portion constituted of the semiconductor layer and the width of the pedestal portion constituted of the metal layer are set substantially equal to each other and hence, a stepped portion attributed to the difference in width between the semiconductor layer and the metal layer is not formed on the periphery of the pedestal thus eliminating possibility that the stepped portion of the pedestal comes into contact with the spacer on the counter substrate side.

According to the constitutional feature (4) of the invention, the insulation layer covers the side surface of the pedestal and hence, the formation of a stepped portion between the semiconductor layer and the metal layer can be more reliably eliminated.

According to the constitutional feature (5) of the invention, in forming the pedestal, the same resist pattern is used for forming both the semiconductor layer and the metal layer, and both layers are etched by dry etching and hence, the width of the pedestal portion constituted of the semiconductor layer can be set substantially equal to the width of the pedestal portion constituted of the metal layer. Accordingly, it is possible to manufacture the liquid crystal display device which can suppress peeling-off of the alignment film without making manufacturing steps complicated and without increasing a manufacturing cost.

DESCRIPTION OF THE PREFERRED EMBODIMENT

A liquid crystal display device and a manufacturing method thereof according to the invention are explained in detail hereinafter.

Figure 5:
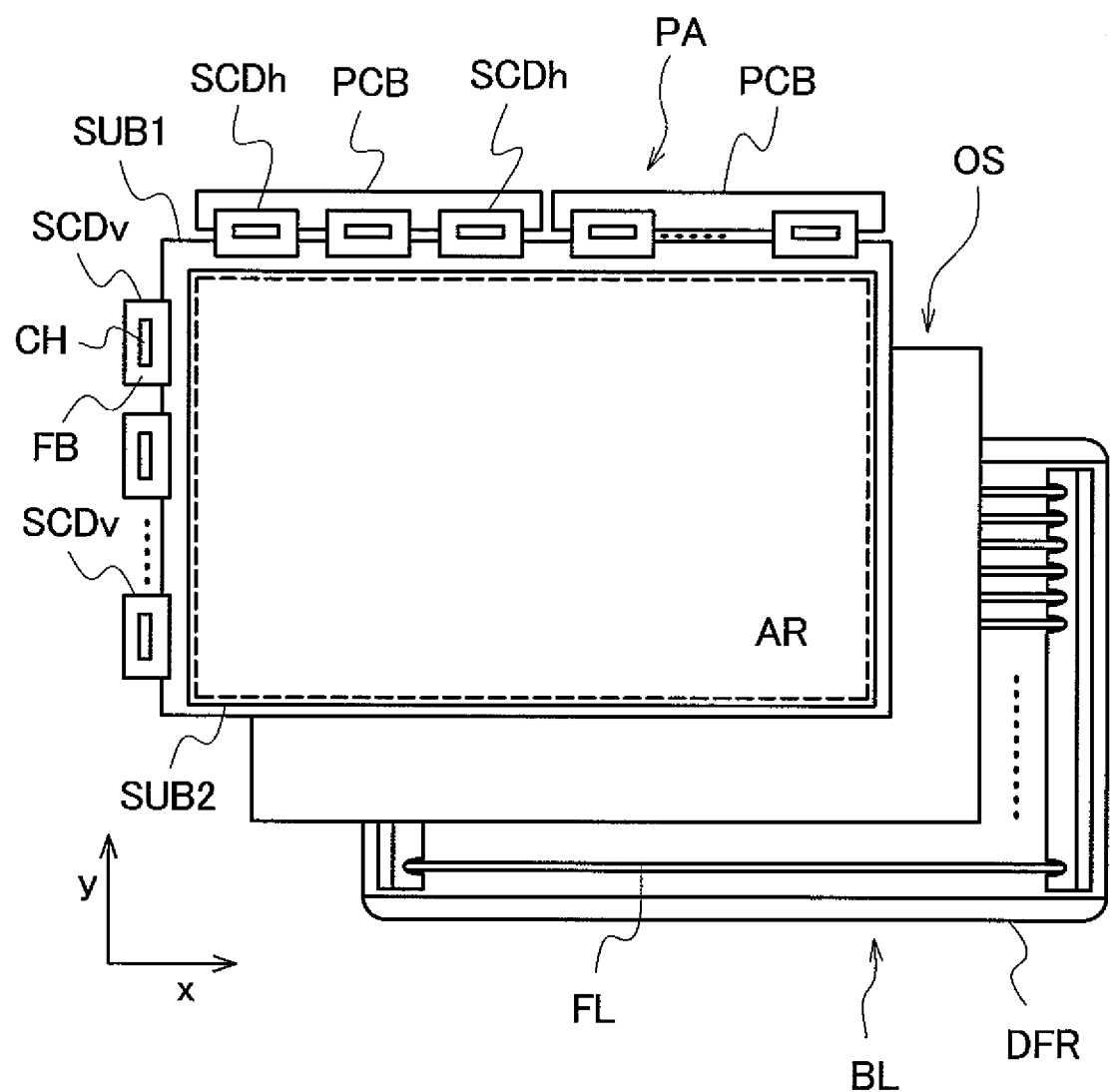
FIG. 5 is a schematic view showing the whole liquid crystal display device according to the invention.

FIG. 5 is a schematic constitutional view of a liquid crystal display device to which the invention is applied. In FIG. 5, a liquid crystal display panel PA, an optical sheet OS and a backlight BL are sequentially arranged from a viewer's side.

The liquid crystal display panel PA includes a pair of substrates SUB1, SUB2 which are arranged parallel to each other and are made of glass, for example, and liquid crystal is sealed between the respective substrates SUB1 and SUB2.

Figure 11:
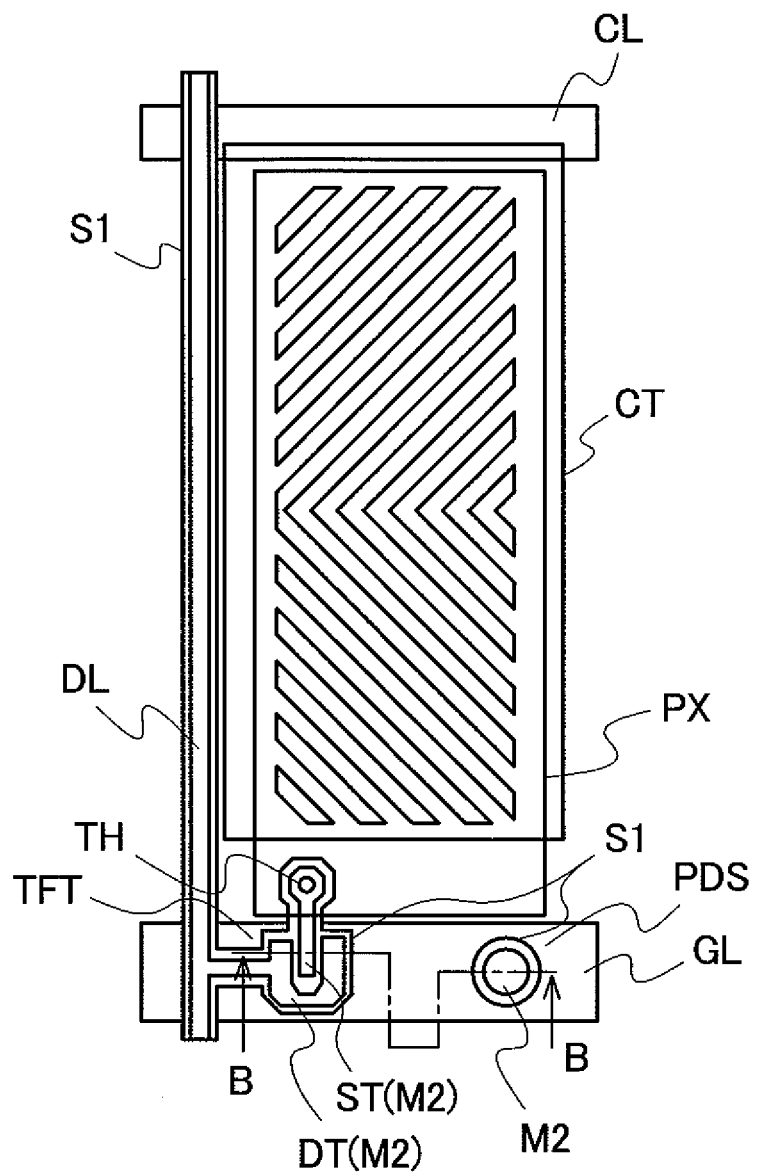
FIG. 11 is a view showing an example of the pixel structure.

On liquid-crystal-side surfaces of the substrates SUB1, SUB2, pixels are formed in a matrix array (see FIG. 11). Optical transmissivity of liquid crystal can be controlled for every pixel.

A region in which these pixels are formed constitutes an image display region AR (a region surrounded by a chained line in the drawing). Light emitted from the backlight BL is radiated to the whole image display region AR, and a viewer recognizes an image by light which passes through the respective pixels.

The substrate SUB1 which is arranged behind the substrate SUB2 as viewed from a viewer's side includes a portion which is exposed from the substrate SUB2 on a left side and an upper side in the drawing. A plurality of driver printed circuit boards SCDh, SCDv are connected to the substrate SUB1 at these exposed portions. These driver printed circuit boards SCDh, SCDv are respectively formed by a TCP (Tape Carrier Package) which is referred to as a TAB (Tape Automated Bonding), a COF (Chip on Film) or the like. A semiconductor chip CH is mounted on an upper surface of the flexible printed circuit board FB on which lines are formed.

The respective driver printed circuit boards SCDh, SCDv are provided for driving the respective pixels independently. For example, the driver printed circuit boards SCDv which are arranged parallel to each other in the y direction in the drawing constitute scanning signal drive circuits, and the driver printed circuit boards SCDh which are arranged parallel to each other in the x direction in the drawing constitute video signal drive circuits.

With respect to the plurality of driver printed circuit boards SCDh which constitute the video signal drive circuits, each driver printed circuit board SCDh which has one side thereof connected to the substrate SUB1 has the other side thereof opposite to one side connected to the printed circuit board PCB. Further, external input signals are inputted to the driver printed circuit boards SCDh via the printed circuit board PCB.

Here, external input signals are inputted to the plurality of driver printed circuit boards SCDv which constitute the scanning signal drive circuits through lines formed on a surface of the substrate SUB1 (not shown in the drawing) and hence, a printed circuit board corresponding to the printed circuit board PCB is not provided.

On a back surface of the liquid crystal display panel PA having such a constitution, for example, the backlight BL is arranged by way of an optical sheet unit (optical members) OS which is constituted of a stacked body formed by stacking a prism sheet, a diffusion plate and the like. The optical member OS is configured to guide light emitted from the backlight BL to the liquid crystal display panel PA side while diffusing and focusing the light.

In FIG. 5, the backlight BL is a so-called direct backlight, and is constituted such that a plurality of fluorescent tubes FL each of which constitutes a linear light source are arranged parallel to each other in a box-shaped casing (frame member DFR). In place of the direct backlight, this embodiment may also adopt a backlight in which point light sources such as light emitting diodes are arranged in plane.

Figure 6:
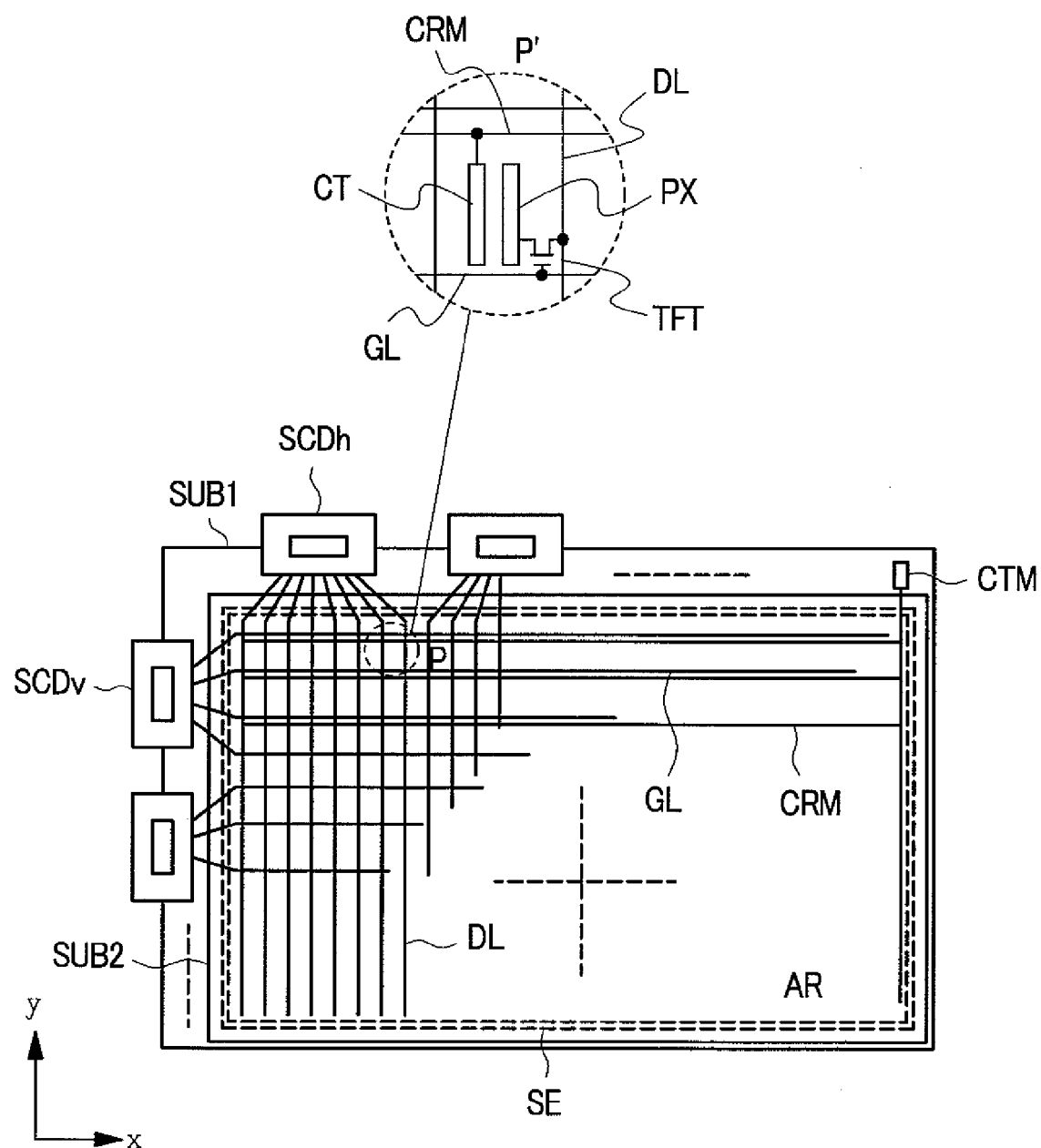
FIG. 6 is a schematic view showing the whole liquid crystal display panel which is used in the liquid crystal display device according to the invention.

Next, electrodes and the lines which are formed on the substrate SUB1 are explained in conjunction with FIG. 6. The substrate SUB1 has a larger area than the substrate SUB2, and the substrate SUB1 has a region which is exposed from the substrate SUB2 on a left-side portion and an upper-side portion thereof in the drawing, for example.

In the region on the left-side portion of the substrate SUB1, the plurality of driver printed circuit boards SCDv (scanning signal drive circuits) are arranged parallel to each other, and in the region on the upper side portion of the substrate SUB1, the plurality of driver printed circuit boards SCDh (video signal drive circuits) are arranged parallel to each other. The driver printed circuit boards SCDv constitute the scanning signal drive circuits and are connected to the gate scanning lines GL, and the driver printed circuit boards SCDh constitute the video signal drive circuits and are connected to the drain signal lines DL.

On a liquid-crystal-side surface of the substrate SUB1 and within the liquid crystal display region AR, the gate scanning lines GL which extend in the x direction and are arranged parallel to each other in the y direction in the drawing and the drain signal lines DL which extend in the y direction and are arranged parallel to each other in the x direction in the drawing are formed.

A rectangular region surrounded by a pair of neighboring gate scanning lines GL and a pair of neighboring drain signal lines DL constitutes a region in which the pixel is formed. Due to such a constitution, the respective pixels are arranged in a matrix array within the liquid crystal display region AR.

Left end portions of the respective gate scanning lines GL get over the sealing material SE, extend to the outside of the liquid crystal display region AR, and are connected to output terminals of the driver printed circuit boards SCDv arranged adjacent to the liquid crystal display region AR. The scanning signals (voltages) are supplied to the respective gate scanning lines GL from the driver printed circuit boards SCDv.

Upper end portions of the respective drain scanning lines DL get over the sealing material SE, extend to the outside of the liquid crystal display region AR, and are connected to output terminals of the driver printed circuit boards SCDh arranged adjacent to the liquid crystal display region AR. The video signals (voltages) are supplied to the respective drain signal lines DL from the driver printed circuit boards SCDh.

In the pixel, for example, as shown in a circle frame P' which is an enlarged view of a circle frame P, a thin film transistor TFT which is turned on in response to a scanning signal (voltage) from the gate scanning line GL, a pixel electrode PX to which a video signal (voltage) from the drain signal line DL is supplied via the thin film transistor TFT which is turned on, and a common electrode CT to which a fixed reference signal (voltage) is applied and which generates an electric field due to a potential difference between the common electrode CT and the pixel electrode PX. FIG. 11 should be referenced with respect to a specific example of the pixel.

Both the pixel electrode PX and the common electrode CT are formed on the same substrate SUB1, and the electric field partially contains an electric field component parallel to a surface of the substrate SUB1. A method which moves (drives) liquid crystal molecules using such an electric field is referred to as an IPS (In-Plane-Switching) method.

Here, a predetermined voltage is applied to the common electrodes CT via common lines CL which are arranged parallel to the gate scanning lines GL, and the common lines CL get over the sealing material SE and are connected to a common voltage terminal CTM which is formed on the surface of the substrate SUB1.

Figure 7:
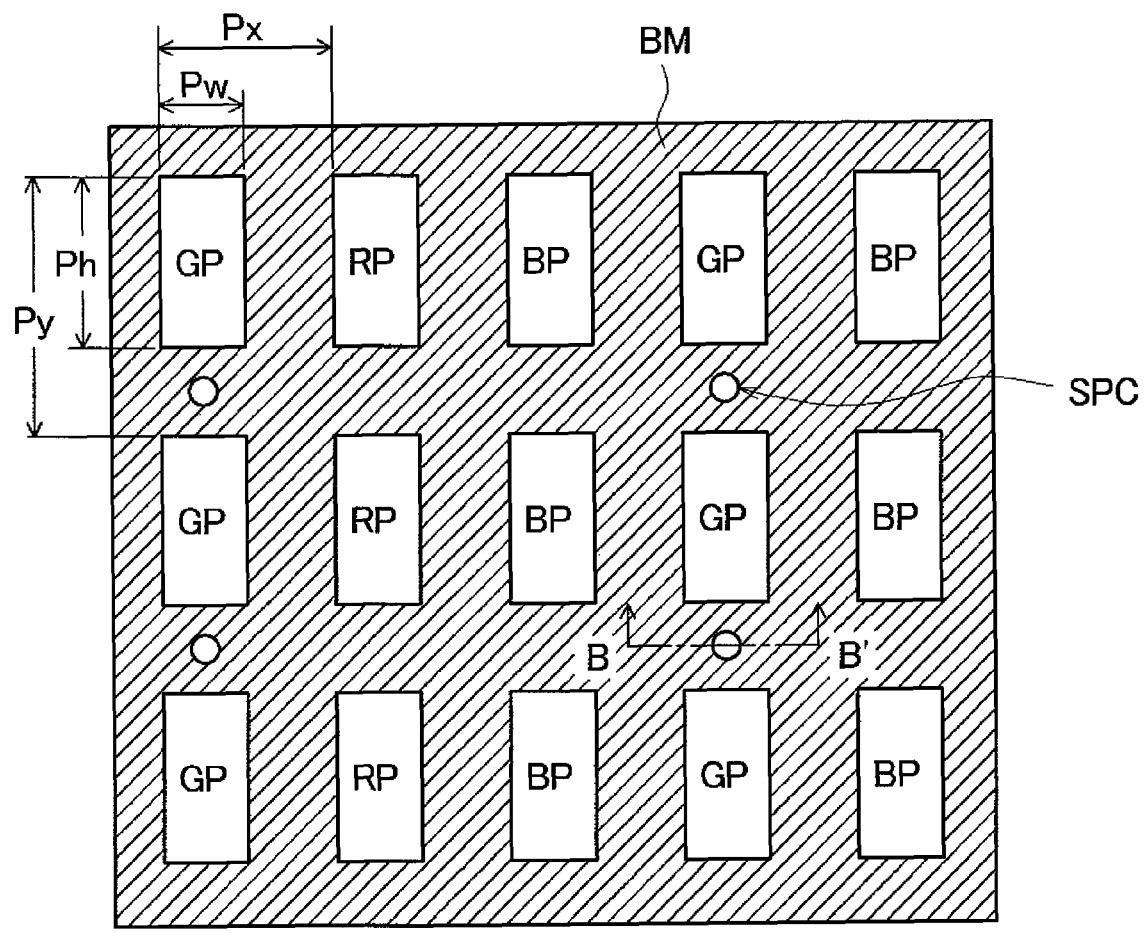
FIG. 7 is a view showing the arrangement of pixels and spacers which are formed on a counter substrate.

FIG. 7 is a view showing an arrangement example of the pixels within the display region of the substrate SUB2 which constitutes the counter substrate. In FIG. 7, the red pixels RP, the blue pixels BP and the green pixels GP are arranged in the lateral direction at a fixed pitch Px. To be more accurate, the red pixels RP, the blue pixels BP, the green pixels GP and the like are holes formed in a BM corresponding to the red pixels RP, the blue pixels BP and the green pixels GP. However, to avoid the use of difficult terms, these parts are merely referred to as the red pixels RP, the blue pixels BP and the green pixels GP. The pixels of the same color are arranged in the longitudinal direction at a fixed pitch Py. A width of each pixel is Pw, and a longitudinal size of each pixel is Ph. A lateral pitch Px is set to 170 µm, for example, and a longitudinal pitch Py is set to 510 µm, for example. A width Pw of the pixel is set to 143 µm, and a longitudinal size Ph of the pixel is set to 410 µm.

As shown in FIG. 7, spacers SPC are formed on the black matrix BM defined between the pixels arranged in the longitudinal direction and hence, a longitudinal length of a region used for forming the spacer SPC is 100 µm (size: Py-Ph). A width of the region in the lateral direction used for forming the spacer is determined depending on a pedestal forming region on the gate scanning line.

Figure 8:
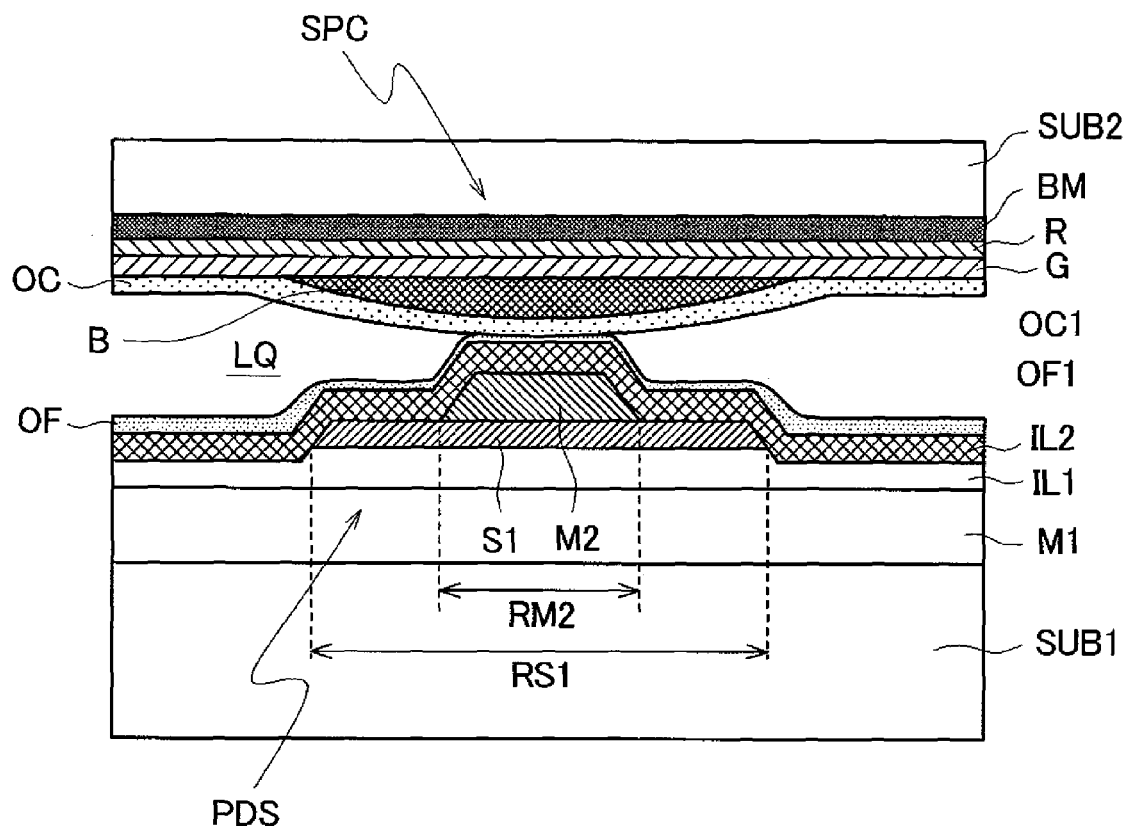
FIG. 8 is a cross-sectional view showing the liquid crystal display device according to a first embodiment of the invention.
Figure 10:
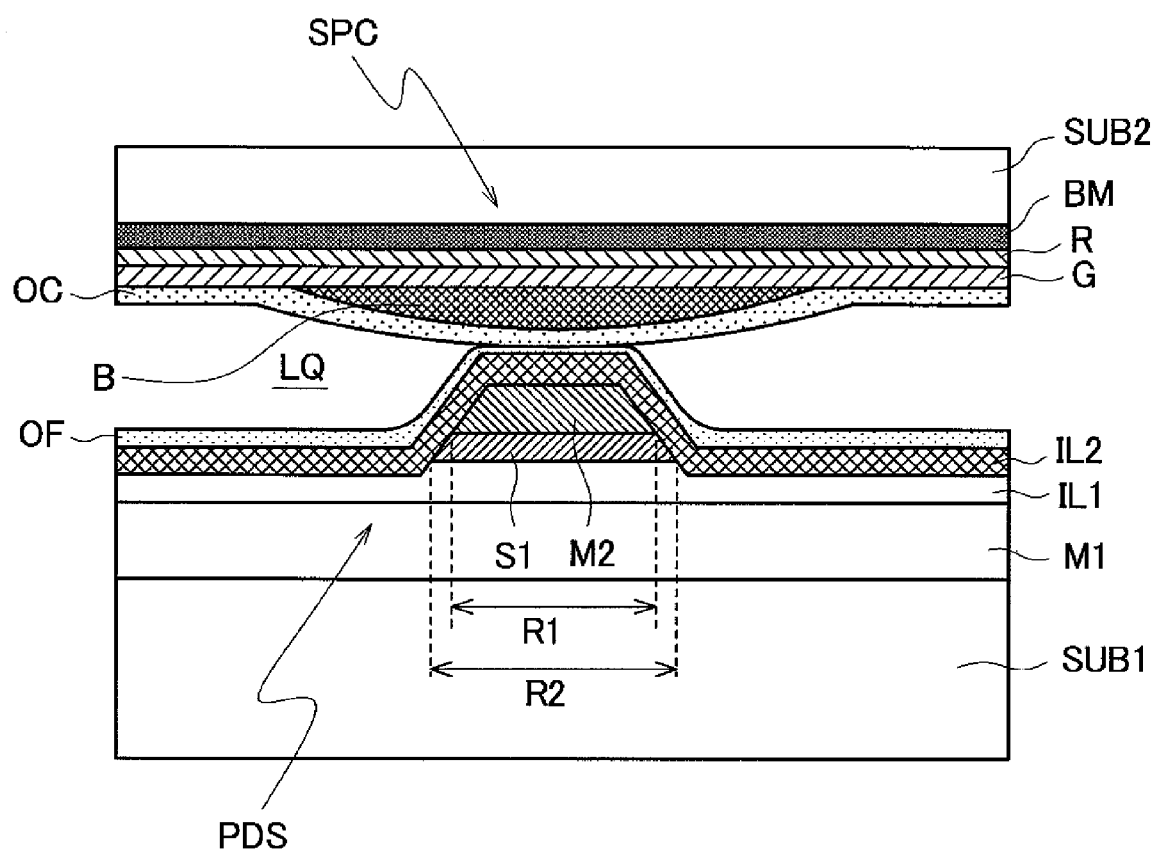
FIG. 10 is a cross-sectional view showing the liquid crystal display device according to a second embodiment of the invention.

In FIG. 7, the spacer SPC has a circular planar shape. When it is necessary to increase an area of the spacer, the spacer may have an elliptical planar shape or a rectangular planar shape. FIG. 7 shows only a planar shape of the spacer. FIG. 8 and FIG. 10 are cross-sectional views taken along a line B-B' in FIG. 7.

The first technical feature of the liquid crystal display device of the invention is as follows. As shown in FIG. 8, in the liquid crystal display device which includes the TFT substrate SUB1, the counter substrate SUB2 and the liquid crystal LQ sandwiched therebetween, a plurality of color filters (R,G,B) are arranged on the counter substrate SUB2, the spacer SPC is formed by stacking the plurality of color filters and by covering a surface of the stacked color filters with an overcoat layer OC. On the TFT substrate SUB1, the pedestals PDS are formed in a state where the pedestal PDS faces the spacer SPC in an opposed manner. The pedestal PDS is formed by stacking at least the semiconductor layer S1 and the metal layer M2 which are formed simultaneously with the thin film transistor TFT on the TFT substrate, and a surface of the stacked body is covered with an insulation film IL2. Further, an alignment film OF is formed on a surface of the insulation film IL2. For increasing an area of the alignment film OF arranged on both sides of the pedestal which is adhered to the insulation film IL2, a width RS1 of a pedestal portion constituted of the semiconductor layer S1 is set sufficiently larger than a width RM2 of the pedestal portion constituted of the metal layer M2.

Figure 4:
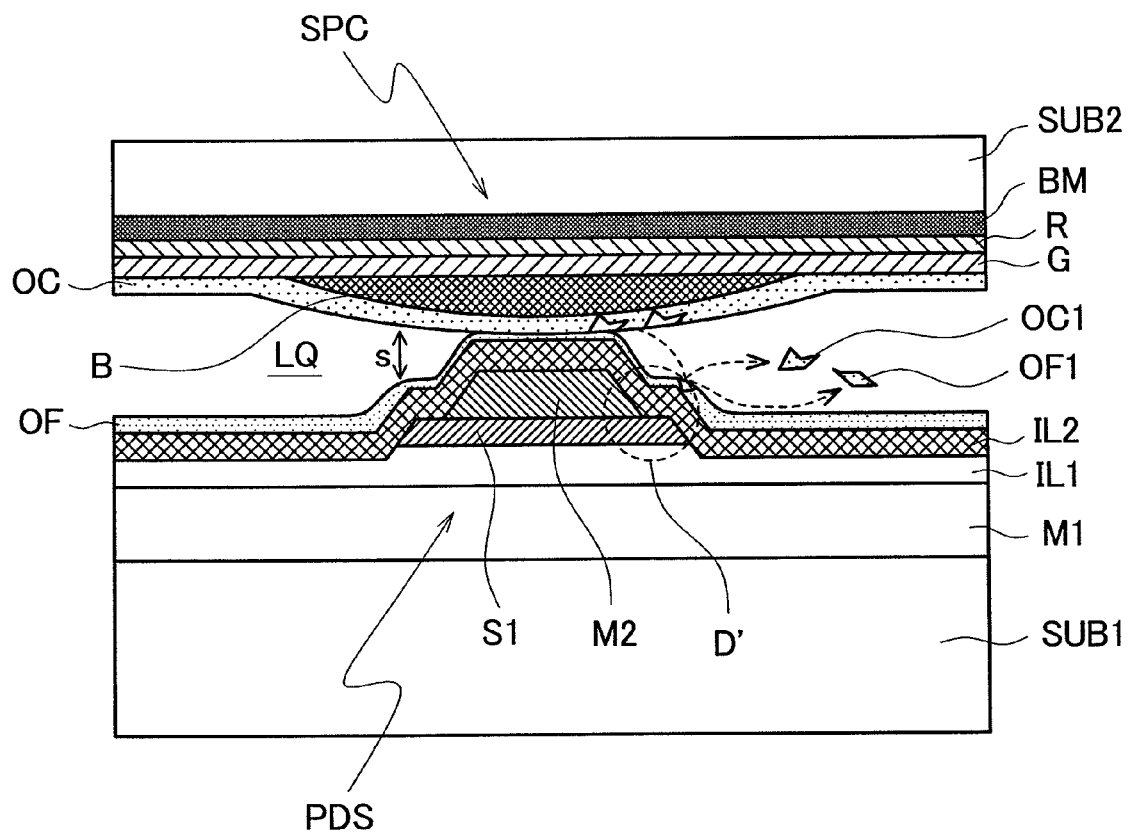
FIG. 4 is a cross-sectional view showing a spacer and a pedestal of the conventional liquid crystal display device.

To be more specific, although the width RM2 of the metal layer M2 is substantially equal to the width of the metal layer M2 shown in FIG. 4, the width RS1 of the semiconductor layer S1 is set substantially equal to a width of the spacer SPC (a width of the color filter B which constitutes a projecting portion).

Here, in FIG. 8, symbol BM indicates the black matrix, symbol M1 indicates the metal layer which is used in forming the gate scanning line GL, symbol IL1 indicates an insulation film or the like which is formed on the gate scanning line GL, and these symbols respectively have substantially same meanings as symbols used in FIG. 1 to FIG. 4 showing the above-mentioned conventional example. The same goes for the constitution shown in FIG. 10.

In the liquid crystal display device according to the invention, the pedestal PDS is constituted as shown in FIG. 8. That is, the width RM1 of the pedestal portion which is constituted of the semiconductor layer S1 is set sufficiently larger than the width RM2 of the pedestal portion which is constituted of the metal layer M2. Accordingly, a possibility that a stepped portion of the pedestal PDS is brought into contact with the surface of the spacer SPC so that the stepped portion is rubbed by the surface of the pedestal PDS can be largely reduced and hence, it is possible to suppress the peeling-off of the alignment film OF or the overcoat film OC.

Figure 1A:
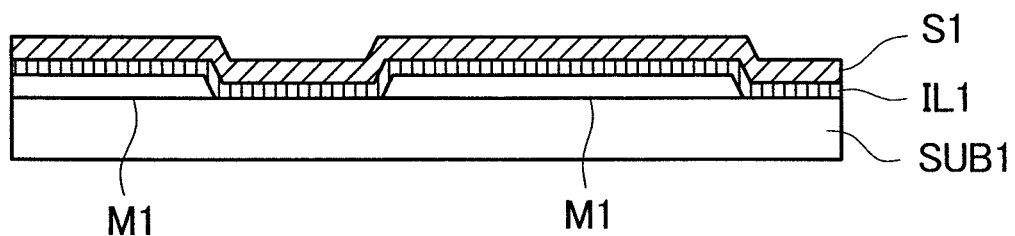
FIG. 1A to FIG. 1C are views (first part) showing a manufacturing method of a conventional liquid crystal display device.
Figure 1B:
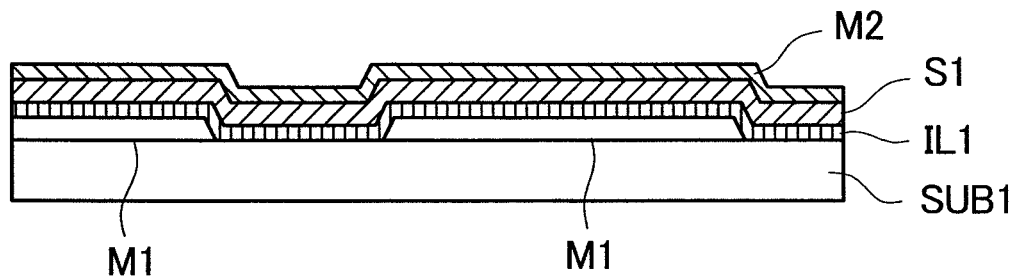
Figure 1C:
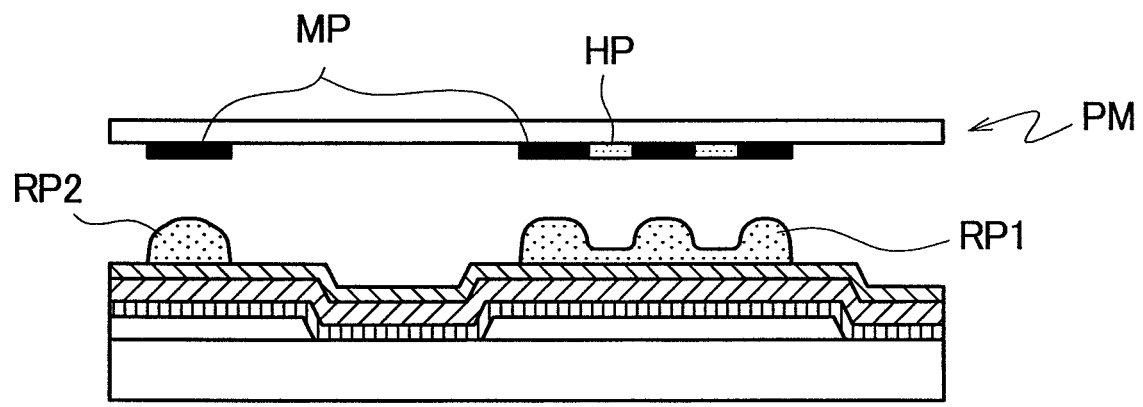
Figure 2D:
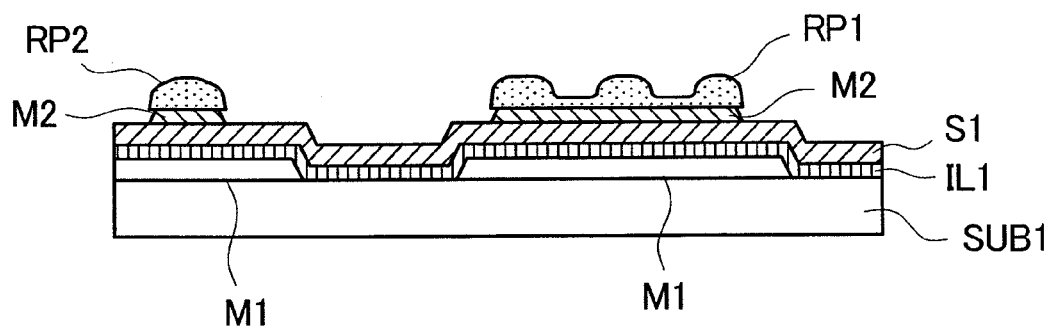
FIG. 2D to FIG. 2G are views (second part) showing the manufacturing method of the conventional liquid crystal display device.
Figure 2E:
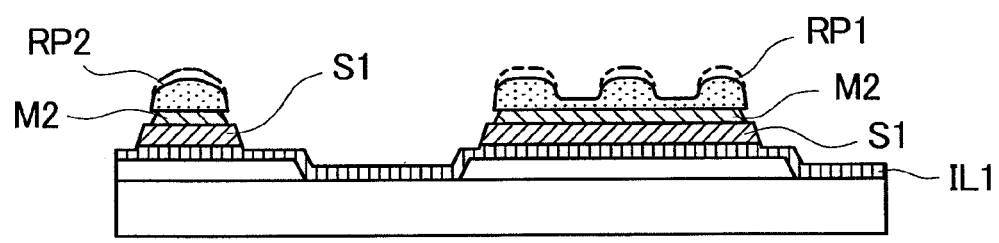
Figure 2F:
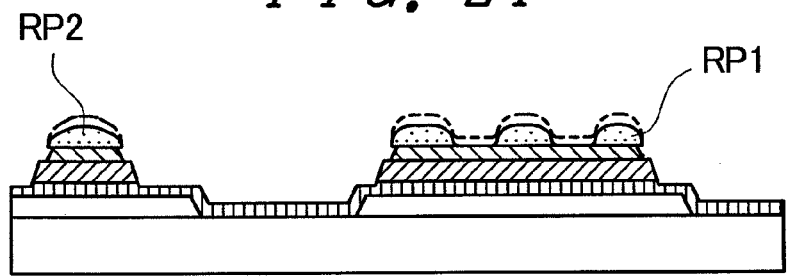
Figure 2G:
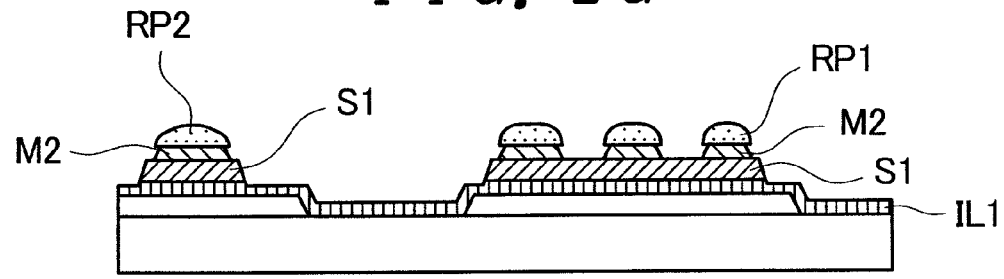
Figure 3H:
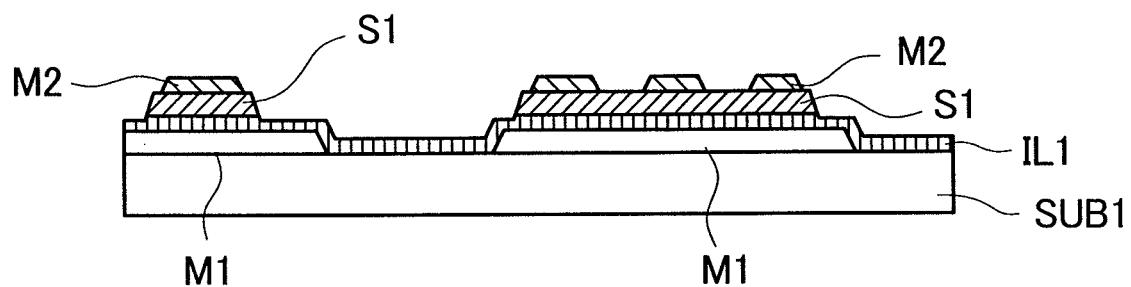
FIG. 3H to FIG. 3J are views (third part) showing the manufacturing method of the conventional liquid crystal display device.
Figure 3I:
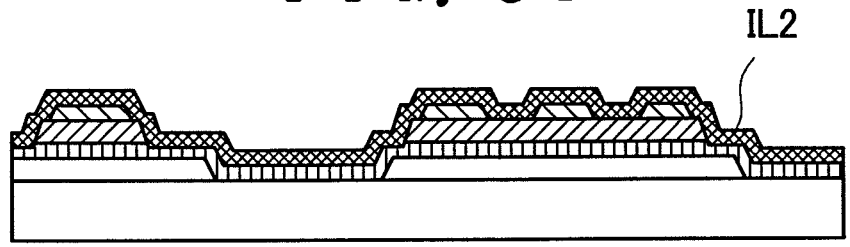
Figure 3J:
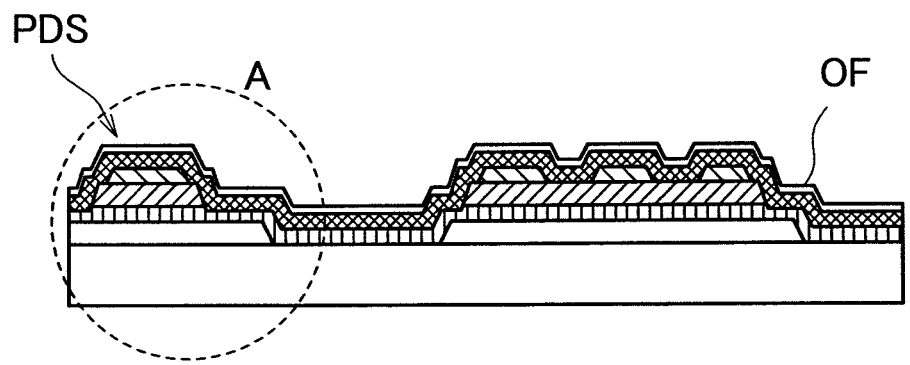

As a manufacturing method of the pedestal PDS shown in FIG. 8, the manufacturing method of the TFT substrate of the liquid crystal display device which has been explained in conjunction with FIG. 1 to FIG. 3 can be used. That is, a mask pattern MP for forming the pedestal of a photo mask PM shown in FIG. 1C (mask pattern MP on the left side in the drawing) can be formed using a pattern shown in FIG. 9.

Figure 9:
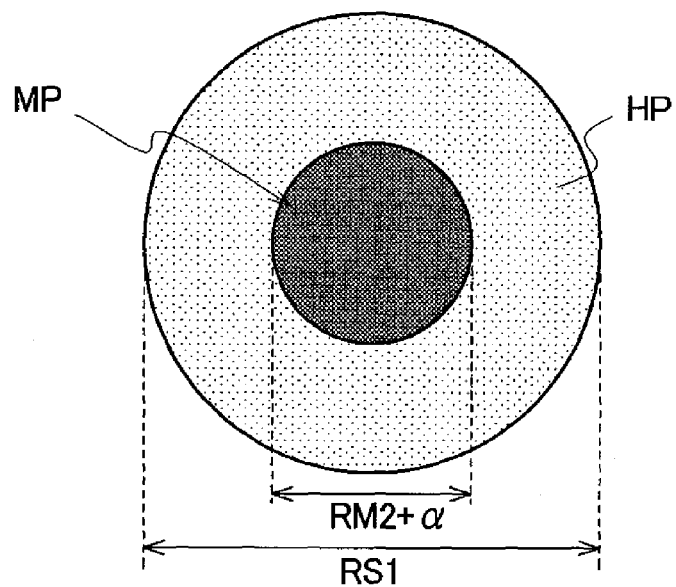
FIG. 9 is a view showing a mask pattern including a half exposure pattern which is used in manufacturing the pedestal shown in FIG. 8.

In FIG. 9, a portion of a mask pattern corresponding to the metal layer M2 is formed of a mask pattern MP having a normal thickness, and a portion of the mask pattern corresponding to the semiconductor layer S1 is formed of a half-exposing pattern portion HP having a small thickness. Here, a width of the mask pattern MP is set slightly larger than a width RM2 of the metal layer M2 by taking the retraction of the metal layer during etching into consideration. Further, the width RS1 of the half-exposing pattern portion HP is set substantially equal to the width of the color filter B which is formed as the spacer SPC.

By making use of the half-exposing pattern shown in FIG. 9, it is possible to leave the semiconductor layer S1 with the width RS1 of the half-exposing pattern in etching the semiconductor S1 shown in FIG. 2E, while it is possible to leave the metal layer M2 with the width RM2+α of the mask pattern shown in FIG. 9 in etching the metal layer M2 as shown in FIG. 2G. Accordingly, it is possible to manufacture the liquid crystal display device which can suppress peeling-off of the alignment film or the like while suppressing the complication of manufacturing steps and the increase of a manufacturing cost.

The pedestal PDS is usually formed on the metal layer M1 which constitutes the gate scanning line and hence, a maximum width of the semiconductor layer S1 which constitutes the pedestal in the width direction of the gate scanning line (in the extending direction of the drain signal line) can be increased up to a line width of the gate scanning line. Accordingly, by setting the width RS1 of the pedestal portion which is constituted of the semiconductor layer S1 substantially equal to the line width of the gate scanning line, the alignment film can sufficiently ensure an area where the alignment film is adhered to the insulation film and, at the same time, it is possible to more reliably obviate a contact of the spacer on the counter substrate side with a peripheral portion (a stepped portion or the like) of the pedestal on the TFT substrate side.

Next, the second technical feature of the liquid crystal display device of the invention is as follows. As shown in FIG. 10, in the liquid crystal display device which includes the TFT substrate SUB1, the counter substrate SUB2 and the liquid crystal LQ sandwiched therebetween, a plurality of color filters (R,G,B) are arranged on the counter substrate SUB2 and, at the same time, the spacers SPC are formed on the counter substrate SUB2 by stacking the plurality of color filters and by covering a surface of the stacked color filters with an overcoat layer OC. On the TFT substrate SUB1, the pedestals PDS are formed in a state where the pedestal faces the spacer in an opposed manner. The pedestal is formed by stacking at least the semiconductor layer S1 and the metal layer M2 which are formed simultaneously with the thin film transistor on the TFT substrate SUB1, and a surface of the stacked body is covered with an insulation film IL2. Further, an alignment film OF is formed on a surface of the insulation film IL2, and a width R2 of the pedestal portion constituted of the semiconductor layer S1 is set substantially equal to a width R1 of the pedestal portion constituted of the metal layer M2.

To be more specific, a side surface of the semiconductor layer S1 and a side surface of the metal layer M2 are formed continuously and uniformly and hence, the side surfaces are formed into a shape where the stepped portion shown in the portion D' in FIG. 4 is eliminated. Accordingly, there is no possibility that a stepped portion of the pedestal PDS comes into contact with the spacer on the counter substrate side and hence, the occurrence of peeling-off of the alignment film OF or the overcoat layer OC can be effectively suppressed.

As a manufacturing method of the pedestal PDS shown in FIG. 10, the manufacturing method of the TFT substrate of the liquid crystal display device explained in conjunction with FIG. 1 to FIG. 3 is used. Particularly, in etching the metal layer M2 in steps shown in FIG. 2D to FIG. 2G, in place of conventional wet etching, dry etching is used. By using dry etching, with respect to the resist pattern arranged on the metal layer M2, it is possible to prevent the development of etching of the metal layer M2 to an extent that the etching enters the inside of the resist pattern. Accordingly, the width R2 of the pedestal portion constituted of the semiconductor layer S1 can be set substantially equal to the width R1 of the pedestal portion constituted of the metal layer M2.

Further, even when the metal layer M2 is etched again in FIG. 2G, there is no possibility that etching of the metal layer M2 develops to an extent that the etching enters the inside of the resist pattern RP2. Eventually, as shown in FIG. 10, the width R2 of the pedestal portion constituted of the semiconductor layer S1 can be set substantially equal to the width R1 of the pedestal portion constituted of the metal layer M2.

Further, also in the embodiment shown in FIG. 10, it is possible to increase the width R2 of the semiconductor layer S1 up to the line width of the gate scanning line GL.

In the above-mentioned respective embodiments, the explanation has been made with respect to a case where the pedestal PDS has a circular shape. However, provided that the pedestal PDS is of a size which allows the formation of the pedestal PDS on the gate scanning line GL, the pedestal PDS can have any other shapes such as a quadrangular shape.

As has been explained heretofore, according to the invention, it is possible to provide the liquid crystal display device and the manufacturing method thereof which can suppress chipping of the alignment film or the like. Further, it is also possible to provide the liquid crystal display device and the manufacturing method thereof which can obviate the complication of manufacturing steps and the increase of a manufacturing cost.

What is claimed is:

1. A liquid crystal display device comprising:
a TFT substrate;
a counter substrate; and
liquid crystal sandwiched between the TFT substrate and the counter substrate,
wherein a plurality of different color filters are arranged on the counter substrate, and
spacers are formed by stacking the plurality of different color filters and by covering a surface of the stacked different color filters with an overcoat layer,
pedestals are formed on the TFT substrate in a state where the pedestal faces the spacer in an opposed manner,
an alignment film is formed between the pedestals and the liquid crystal,
wherein the pedestal is formed by stacking, on a gate scanning line, at least a semiconductor layer and a metal layer which are formed simultaneously with a thin film transistor on the TFT substrate, a width of the semiconductor layer in a direction of extension of the gate scanning line is substantially equal to a largest width of the spacer in the direction of extension of the gate scanning line, and a width of the metal layer in the direction of extension of the gate scanning line is substantially smaller than a largest width of the spacer in the direction of extension of the gate scanning line, and
wherein a width of the semiconductor layer in a direction of extension of a drain signal line is substantially equal to a width of the gate scanning line in the direction of extension of the drain signal line.

2. A liquid crystal display device according to claim 1, wherein an insulation film and the alignment film are formed on a liquid crystal side of the semiconductor layer and the metal layer of the pedestal, and a width of the semiconductor layer at the pedestal portion is substantially equal to a width of the gate scanning line.

3. A liquid crystal display device according to claim 1, wherein a portion of the pedestal having a width corresponding to the width of the metal layer is arranged for contact with the spacer formed of the stacked different color filter and a stepped portion of the pedestal is provided at a position corresponding to the width of the semiconductor layer so as to be spaced sufficient distance from the spacer to substantially avoid contact with a surface of the spacer and substantially suppress peeling-off of at least one of the overcoat layer and the alignment film.

4. A liquid crystal display device according to claim 3, wherein the metal layer is stacked on the semiconductor layer and is disposed closer to the spacer than the semiconductor layer.

5. A liquid crystal display device according to claim 1, wherein the spacer has an elliptical planar shape.

6. A liquid crystal display device according to claim 1, wherein the spacer has a rectangular planar shape.

* * * * *